United States Patent
Tanaka et al.

(10) Patent No.: US 11,311,946 B2
(45) Date of Patent: Apr. 26, 2022

(54) COATED TOOL AND CUTTING TOOL INCLUDING THE SAME

(71) Applicant: KYOCERA CORPORATION, Kyoto (JP)

(72) Inventors: Ayano Tanaka, Satsumasendai (JP); Ryoma Nomiyama, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/982,059

(22) PCT Filed: Mar. 15, 2019

(86) PCT No.: PCT/JP2019/010855
§ 371 (c)(1),
(2) Date: Sep. 18, 2020

(87) PCT Pub. No.: WO2019/181786
PCT Pub. Date: Sep. 26, 2019

(65) Prior Publication Data
US 2021/0107066 A1 Apr. 15, 2021

(30) Foreign Application Priority Data
Mar. 20, 2018 (JP) ............................ JP2018-052842

(51) Int. Cl.
| | |
|---|---|
| *B23B 27/14* | (2006.01) |
| *B23C 5/16* | (2006.01) |
| *C23C 16/34* | (2006.01) |
| *C23C 16/40* | (2006.01) |
| *C23C 28/04* | (2006.01) |
| *C23C 16/36* | (2006.01) |

(Continued)

(52) U.S. Cl.
CPC .............. *B23B 27/148* (2013.01); *B23C 5/16* (2013.01); *C22C 29/005* (2013.01); *C22C 29/04* (2013.01);
(Continued)

(58) Field of Classification Search
CPC ......... B23B 27/14; B23B 27/148; B23C 5/16; B23C 2224/04; B23C 2224/32; C23C 16/36; C23C 16/403; C23C 28/044
(Continued)

(56) References Cited

U.S. PATENT DOCUMENTS 5,447,549 A * 9/1995 Yoshimura .............. C22C 29/00
                                                                75/238
6,007,909 A   12/1999 Rolander et al.
(Continued)

FOREIGN PATENT DOCUMENTS

EP          1829990 A1    9/2007
JP          S6431972 A    2/1989
(Continued)

*Primary Examiner* — Archene A Turner
(74) *Attorney, Agent, or Firm* — Viering, Jentschura & Partner mbB

(57) ABSTRACT

A coated tool of the present disclosure may include a base and a coating layer covering at least a part of the base. The base may include a hard phase of a carbonitride including Ti and a binder phase including at least one of Co and Ni and has a thermal expansion coefficient at 25 to 1000° C. of $9.0 \times 10^{-6}/°$ C. or more. The coating layer may include a TiCN layer and an $Al_2O_3$ layer positioned on the TiCN layer. The TiCN layer may have a compressive stress of 250 to 500 MPa. The $Al_2O_3$ layer may have a thickness of 2 μm or more and a compressive stress of 450 MPa or more, and the value of the compressive stress is greater than the compressive stress of the TiCN layer.

6 Claims, 2 Drawing Sheets

(51) Int. Cl.
*C22C 29/00* (2006.01)
*C22C 29/04* (2006.01)
*B32B 5/16* (2006.01)

(52) U.S. Cl.
CPC ............ *C23C 16/347* (2013.01); *C23C 16/36* (2013.01); *C23C 16/40* (2013.01); *C23C 16/403* (2013.01); *C23C 28/044* (2013.01); *B23C 2224/04* (2013.01); *B23C 2224/32* (2013.01); *B32B 5/16* (2013.01)

(58) Field of Classification Search
USPC ................................ 428/216, 336, 698, 701
See application file for complete search history.

(56) References Cited

U.S. PATENT DOCUMENTS

| | | |
|---|---|---|
| 2008/0075543 A1 | 3/2008 | Zhu et al. |
| 2009/0223333 A1 | 9/2009 | Tanibuchi |
| 2010/0232893 A1* | 9/2010 | Imamura .............. C23C 28/042 407/119 |
| 2011/0182682 A1 | 7/2011 | Abukawa et al. |
| 2016/0160347 A1 | 6/2016 | Liu et al. |

FOREIGN PATENT DOCUMENTS

| | | |
|---|---|---|
| JP | H05230587 A | 9/1993 |
| JP | H0892685 A | 4/1996 |
| JP | H11511078 A | 9/1999 |
| JP | 2004223666 A | 8/2004 |
| JP | 2006272515 A | 10/2006 |
| JP | 2009050997 A | 3/2009 |
| JP | 2009107059 A | 5/2009 |
| JP | 2010105099 A | 5/2010 |
| JP | 2011038174 A | 2/2011 |
| JP | 2017035750 A | 2/2017 |
| WO | 2008026700 A1 | 3/2008 |
| WO | 2010010648 A1 | 1/2010 |
| WO | 2017/115987 * | 6/2017 |

* cited by examiner ately represent the actual dimensions of components or dimensional ratio between members. These points are applicable to a cutting tool described later.
COATED TOOL AND CUTTING TOOL INCLUDING THE SAME

CROSS-REFERENCE TO RELATED APPLICATIONS

This application is a national stage entry according to 35 U.S.C. 371 of PCT Application No. PCT/JP2019/010855 filed on Mar. 15, 2019, which claims priority to Japanese Application No. 2018-052842 filed on Mar. 20, 2018, which is entirely incorporated herein by reference.

TECHNICAL FIELD

The present disclosure relates to a coated tool for use in a cutting process and a cutting tool including the same.

BACKGROUND

Cermets including titanium as a main component are now widely used as bases of members requiring wear resistance, sliding property, and fracture resistance, such as cutting tools, wear-resistant members, and sliding members.

Patent Literature 1 discusses improvement in peeling resistance of coating, shock resistance, and fracture resistance by forming a coating on a surface of a base made of a cermet, imparting a compressive stress of 30 kgf/mm$^2$ or more to the base surface, and imparting a compressive stress of 50 kgf/mm$^2$ to the coating.

Patent Literature 2 discusses provision of a cutting tool insert having a CVD film free from cooling cracks that may cause performance degradation, in which a wear-resistant CVD film is provided on a surface of titanium-based carbonitride, and the CVD film has a compressive stress of 0 to 1000 MPa.

Patent Literature 1: Japanese Patent Application Laid-open No. H08-092685
Patent Literature 2: Japanese Unexamined Patent Application Publication (Translation of PCT Application) No. H11-511078

SUMMARY

A coated tool according to the present disclosure may include a base and a coating layer covering at least a part of the base. The base may include a hard phase of a carbonitride including Ti, and a binder phase including at least one of Co and Ni, the base has a thermal expansion coefficient at 25 to 1000° C. of 9.0×10$^{-6}$/° C. or more. The coating layer may include a TiCN layer and an Al$_2$O$_3$ layer positioned on the TiCN layer. The TiCN layer may have a compressive stress of 250 to 500 MPa. The Al$_2$O$_3$ layer may have a thickness of 2 μm or more and may have a compressive stress of 450 MPa or more, and a value of the compressive stress may be greater than the compressive stress of the TiCN layer.

A cutting tool according to the present disclosure may include a holder extending from a first end to a second end and may have a pocket on the first end side; and the coated tool may be positioned in the pocket.

DETAILED DESCRIPTION

Figure 1:
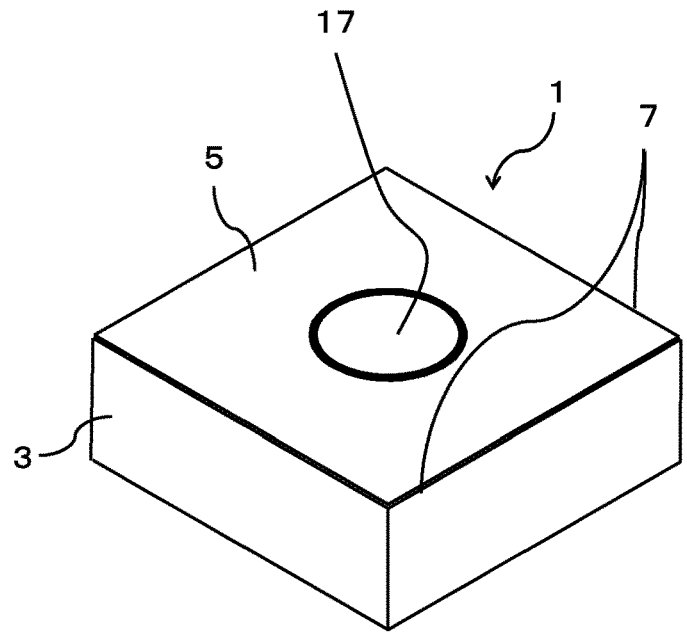
FIG. 1 is a perspective view illustrating a non-limiting example of a coated tool of the present disclosure.

<Coated Tool>
A coated tool of the present disclosure will be described in detail below with reference to the drawings. The drawings hereinafter referred to are simplified to illustrate only the main members necessary for describing various non-limiting embodiments, for convenience of description. The coated tool of the present disclosure therefore may include any components not illustrated in the drawings referred to. The dimensions of members in the drawings do not exactly represent the actual dimensions of components or dimensional ratio between members. These points are applicable to a cutting tool described later.

Figure 2:
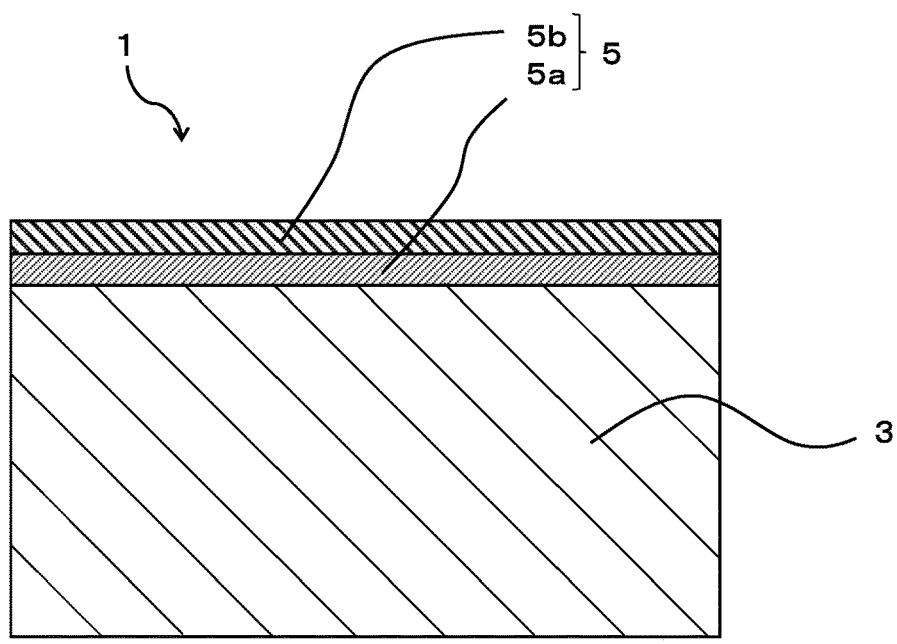
FIG. 2 is an enlarged overview of a cross section in the vicinity of a surface of the coated tool of the present disclosure.

As illustrated in FIG. 1 and FIG. 2, a coated tool 1 of the present disclosure includes a base 3 and a coating layer 5 covering at least a part of the base 3.

The coated tool 1 of the present disclosure has, for example, a quadrangular plate shape, and its upper surface in FIG. 1 is a rake face. The coated tool 1 has a lower surface on the side opposite to the upper surface and a side surface between the upper surface and the lower surface to connect to each of the upper and lower surfaces. At least a part of the side surface is a flank face.

The coated tool 1 of the present disclosure has a cutting edge 7 positioned at at least a part of a ridge line where the upper surface and the side surface meet. In other words, the coated tool 1 has the cutting edge 7 positioned at at least a part of a ridge line where the rake face and the flank face meet.

In the coated tool 1, the entire outer perimeter of the rake face may serve as the cutting edge 7. However, the coated tool 1 is not limited to such a configuration and, for example, may have the cutting edge 7 at only one side, or partially, of the quadrangular rake face.

The size of the coated tool 1 is not limited and, for example, the length of one side of the rake face is set to about 3 to 20 mm. The thickness of the coated tool 1 is set, for example, to about 5 to 20 mm.

The base 3 of the coated tool 1 of the present disclosure includes a hard phase of a carbonitride including Ti and a binder phase including at least one of Co and Ni and has a thermal expansion coefficient at 25 to 1000° C. of 9.0×10$^{-6}$/° C. or more. The hard phase is, for example, TiCN. The base 3 is a cermet and contains TiCN and Co and/or Ni having a thermal expansion coefficient higher than that of TiCN, whereby the thermal expansion coefficient at 25 to 1000° C. is adjusted to 9.0×10$^{-6}$/° C. or more.

The cermet is a sintered composite material that is a combination of a ceramic component and a metal. Specifically, examples of the cermet include, but are not limited to, compounds containing TiCN, TiC, or TiN, etc. as main components. The base 3 may further contain WC as a hard phase.

As illustrated in FIG. 2, the coated tool 1 of the present disclosure has a TiCN layer 5a on the base 3. The TiCN layer 5a includes TiCN crystals. The thermal expansion coefficient of the TiCN crystals is about 8×10$^{-6}$/° C. and is smaller than the thermal expansion coefficient of the base 3 having a thermal expansion coefficient of 9.0×10$^{-6}$/° C. or more.

An $Al_2O_3$ layer 5b is positioned on the TiCN layer 5a. The $Al_2O_3$ layer 5b includes $Al_2O_3$ crystals. The thermal expansion coefficient of the $Al_2O_3$ crystals is about $7.2 \times 10^{-6}/°$ C. and is smaller than the thermal expansion coefficients of the base 3 and the TiCN layer 5a.

The base 3 and the TiCN layer 5a may be in direct contact or, for example, a TiN phase (not illustrated) may be positioned between them. The TiCN layer 5a and the $Al_2O_3$ layer 5b may be in direct contact or, for example, a TiN phase (not illustrated) may be positioned between them.

In the coated tool 1 having such a configuration, an adequate compressive stress can be exerted on the TiCN layer 5a and the $Al_2O_3$ layer 5b by adjusting the thermal expansion coefficient of the base 3 and the thickness of the $Al_2O_3$ layer 5b.

The coated tool excellent in wear resistance and durability can be obtained when the compressive stress exerted on the TiCN layer 5a is 250 to 500 MPa, the compressive stress exerted on the $Al_2O_3$ layer 5b is 450 MPa or more, the thickness of the $Al_2O_3$ layer 5b is 2 μm or more, and the value of the compressive stress exerted on the $Al_2O_3$ layer 5b is larger than the compressive stress exerted on the TiCN layer 5a.

The compressive stresses exerted on the TiCN layer 5a and the $Al_2O_3$ layer 5b may be determined based on measurement using a 2D method. Specifically, a section of the flank face, 1 mm or more away from the cutting edge 7, is set as a measurement location, and X-ray diffraction peaks are measured. For the crystal structure specified from the measurement result, the compressive stress can be obtained by determining how the value of 2θ in the measurement result deviates from the value of 2θ serving as a standard described in the JCPDS card.

When a residual stress has a negative value, the residual stress is compressive stress. When the value of compressive stress is expressed, it is represented by an absolute value with no minus sign.

As the thermal expansion coefficient of the base 3 increases, the values of the compressive stresses exerted on the TiCN layer 5a and the $Al_2O_3$ layer 5b tend to increase.

When the TiCN layer 5a and the $Al_2O_3$ layer 5b that constitute the coating layer 5 are compared, the $Al_2O_3$ layer 5b is at a position more distant from the base 3. When a workpiece is processed using the cutting tool 101 of the present disclosure, therefore, the $Al_2O_3$ layer 5b comes into contact with the workpiece before the TiCN layer 5a. The $Al_2O_3$ layer 5b has a high hardness and a thickness of 2 μm or more and therefore has high wear resistance and oxidation resistance. When the thickness of the $Al_2O_3$ layer 5b is 2.5 μm or more and 8.0 μm or less, the wear resistance and the oxidation resistance are more excellent.

The TiCN layer 5a may have a thickness of 5 μm or more and 10 μm or less. With such a range, the wear resistance and the fracture resistance of the coated tool 1 are excellent.

The thickness of the $Al_2O_3$ layer 5b may be 0.2 to 0.4 times the sum of the thickness of the TiCN layer 5a and the thickness of the $Al_2O_3$ layer 5b. The coated tool 1 having such a configuration is excellent in wear resistance and fracture resistance.

The C axis of the $Al_2O_3$ crystals of the $Al_2O_3$ layer 5b may be oriented along a direction vertical to a main surface of the base 3. To put it another way, the $Al_2O_3$ layer 5b may contain $\alpha$-$Al_2O_3$ crystals, and the $\alpha$-$Al_2O_3$ crystals may be shaped like a column extending in the vertical direction relative to the main surface of the base 3.

With other conditions being the same, when the thickness of the $Al_2O_3$ layer 5b is increased, the value of the compressive stress exerted on the $Al_2O_3$ layer 5b tends to decrease.

The TiCN layer 5a is interposed between the base 3 and the $Al_2O_3$ layer 5b to suppress peeling of the $Al_2O_3$ layer 5b and suppress abrasive wear.

With other conditions being the same, when the thickness of the TiCN layer 5a is increased, the value of the compressive stress exerted on the TiCN layer 5a tends to decrease.

In consideration of the functions of the TiCN layer 5a and the $Al_2O_3$ layer 5b, the sum of the thickness of the TiCN layer 5a and the thickness of the $Al_2O_3$ layer 5b may be 7 μm or more and 18 μm or less. The sum of the thicknesses may be 8 μm or more and 16 μm or less.

In the base 3 in the coated tool 1 of the present disclosure, a binder phase-enriched layer may be present on the surface, which has a higher proportion of the binder phase compared with the inside of the base 3. The thickness of the binder phase-enriched layer may be 1 μm or more and 10 μm or less.

A method of producing the cutting tool of the present disclosure will be described below.

First of all, a base is prepared, which has a hard phase of a carbonitride including Ti and a binder phase including at least one of Co and Ni and has a thermal expansion coefficient at 25 to 1000° C. of $9.0 \times 10^{-6}$ or more. Any base that has a thermal expansion coefficient satisfying the condition above may be employed, and a cermet may be used. The shape of the base is arranged, if necessary.

The binder phase may be composed of Co alone. The base 3 may contain W and Co and may include $Co_{0.93}W_{0.07}$. In preparation of raw materials, the amount of C contained is adjusted to obtain the base containing $Co_{0.93}W_{0.07}$. The amount of C in the raw materials is set such that the prepared composition ratio is C/(hard phase)=8.0 to 9.1. With C/(hard phase) of 9.1 or less, the base containing $Co_{0.93}W_{0.07}$ can be obtained. With C/(hard phase) of 8.0 or more, increase in η phase can be suppressed, and relative reduction of $Co_{0.93}W_{0.07}$ can be suppressed.

The amount of C in the raw materials includes, for example, C included in the raw material powders, in addition to the added carbon. The hard phase refers to the one that may be present as a hard phase in an insert and does not include, for example, metals, oxides, or carbonates of Fe, Ni, Co, Mn, and/or Mo.

After a binder is added to the raw material powder having such a composition range, for example, the powder is formed into a desired shape by press molding and subjected to a debindering step for removing the binder component, and thereafter fired in a nitrogen or vacuum atmosphere in a temperature range of 1500 to 1550° C. to produce a highly dense base.

At the debindering step, the product is held in a vacuum at 200° C. and 300° C. each for 1 hour, and then the temperature is increased to 450° C. and held for 1 hour. At the step at 450° C., in order to suppress redaction of C added as a raw material, $CO_2$ gas is introduced into a debindering furnace at a pressure of 1 to 5 kPa. In this way, the amount of C can be precisely controlled. $Co_{0.93}W_{0.07}$ may be prepared in advance and used as a raw material powder.

Subsequently, a TiCN layer is formed on a surface of the base. An $Al_2O_3$ layer is further formed thereon. The TiCN layer and the $Al_2O_3$ layer may be formed by a chemical vapor deposition (CVD) process. With this CVD process, the higher the deposition temperature is in depositing a film, the greater the compressive stress is exerted on the deposited film. The deposition temperature is thus adjusted, if necessary.

The compressive stresses exerted on the TiCN layer and the $Al_2O_3$ layer can be controlled also by controlling the thicknesses of the TiCN layer and the $Al_2O_3$ layer as described above.

The compressive stresses of the TiCN layer and the $Al_2O_3$ layer of the produced coated tool are once measured, and then the deposition temperature and/or the deposition time is adjusted based on the result of measurement so that the coated tool having a desired compressive stress can be produced.

<Cutting Tool>

The cutting tool of the present disclosure will now be described with reference to the drawings.

Figure 3:
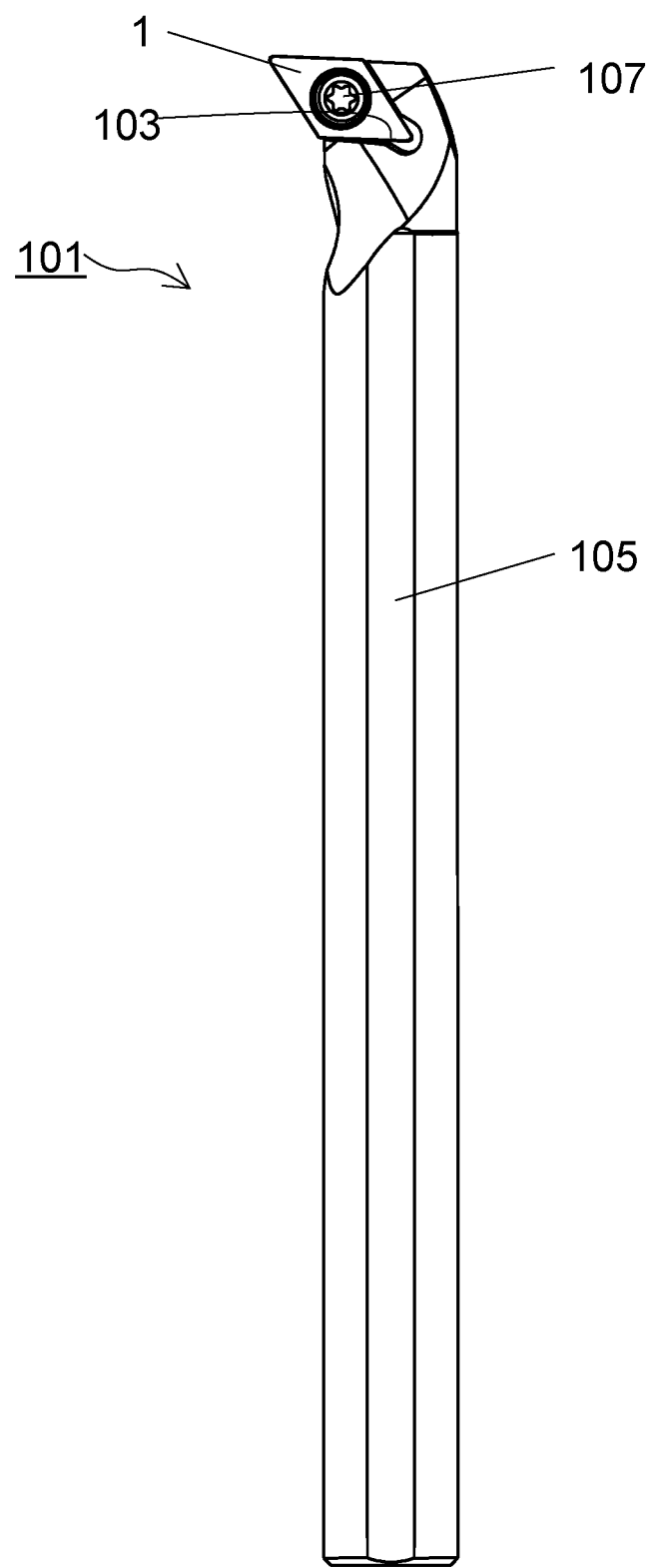
FIG. 3 is a plan view illustrating a non-limiting example of a cutting tool of the present disclosure.

As illustrated in FIG. 3, a cutting tool 101 of the present disclosure is, for example, a rod-shaped body extending from a first end (the upper end in FIG. 3) to a second end (the lower end in FIG. 3). As illustrated in FIG. 3, the cutting tool 101 includes a holder 105 having a pocket 103 on the first end side (tip end side) and the aforementioned coated tool 1 positioned in the pocket 103. Because of the provision of the coated tool 1, the cutting tool 101 can perform a stable cutting process over a long time period.

The pocket 103 is a portion to which the coated tool 1 is attached and has a seat surface parallel to a lower surface of the holder 105 and a constraint side surface inclined relative to the seat surface. The pocket 103 is open on the first end side of the holder 105.

The coated tool 1 is positioned in the pocket 103. The lower surface of the coated tool 1 may be in direct contact with the pocket 103 or a sheet (not illustrated) may be sandwiched between the coated tool 1 and the pocket 103.

The coated tool 1 is attached to the holder 105 such that at least a part of a section used as the cutting edge 7 at the ridge line on which the flank face and the rake face meet protrudes outward from the holder 105. In the non-limiting embodiments, the coated tool 1 is attached to the holder 105 by a fixing screw 107. That is, the coated tool 1 is attached to the holder 105 by inserting the fixing screw 107 into a through hole 17 of the coated tool 1, inserting a tip end of the fixing screw 107 into a screw hole (not illustrated) formed in the pocket 103, and screwing the screw portions together.

For example, steel and cast iron can be used as the material of the holder 105. Among these materials, steel with a high toughness may be used.

In the non-limiting embodiments, a cutting tool for use in a turning process is illustrated by way of example. Examples of the turning process include, but are not limited to, a boring process, an external process, a grooving process, and a facing process. The cutting tool is not limited to the one for use in the turning process. For example, the coated tool 1 in the foregoing non-limiting embodiments may be used for a cutting tool for use in a milling process.

EXAMPLES

The coated tool of the present disclosure will be described below.

The base was produced as follows.

A molded product in the shape of a tool was produced using raw material powders in the proportions indicated in Table 1, subjected to a debindering step, and then fired to produce a base. At the debindering step, the product was held in a vacuum at 200° C. and 300° C. each for 1 hour, and then the temperature was increased to 450° C. and held for 1 hour. At the step at 450° C., $CO_2$ gas was introduced into a debindering furnace at a pressure of 3 kPa. The thermal expansion coefficient of the base is as indicated in Table 1. The base had a binder phase-enriched layer.

TABLE 1

| Sample No. | Base | | | | | | | | | | | Thermal expansion coefficient $[\times 10^{-6}/° C.)]$ |
|---|---|---|---|---|---|---|---|---|---|---|---|---|
| | Amount prepared [mass %] | | | | | | | | | | | |
| | TiCN | TiN | WC | NbC | VC | $Mo_2C$ | $MnCO_3$ | ZrC | Co | Ni | C | |
| 1 | 79.00 | 0.00 | 0.00 | 0.00 | 0.00 | 0.00 | 0.00 | 0.00 | 21.00 | 0.00 | 0.00 | 9.02 |
| 2 | 62.00 | 0.00 | 10.00 | 0.00 | 0.00 | 0.00 | 0.00 | 0.00 | 28.00 | 0.00 | 0.00 | 9.22 |
| 3 | 40.00 | 8.00 | 20.25 | 7.50 | 1.50 | 0.50 | 0.75 | 0.25 | 21.00 | 0.00 | 0.25 | 9.10 |
| 4 | 40.00 | 8.00 | 20.25 | 7.50 | 1.50 | 0.50 | 0.75 | 0.25 | 21.00 | 0.00 | 0.25 | 9.10 |
| 5 | 40.00 | 8.00 | 20.25 | 7.50 | 1.50 | 0.50 | 0.75 | 0.25 | 21.00 | 0.00 | 0.25 | 9.10 |
| 6 | 40.00 | 8.00 | 20.25 | 7.50 | 1.50 | 0.50 | 0.75 | 0.25 | 21.00 | 0.00 | 0.25 | 9.10 |
| 7 | 40.00 | 8.00 | 20.25 | 7.50 | 1.50 | 0.50 | 0.75 | 0.25 | 21.00 | 0.00 | 0.25 | 9.10 |
| 8 | 40.00 | 8.00 | 20.25 | 7.50 | 1.50 | 0.50 | 0.75 | 0.25 | 21.00 | 0.00 | 0.25 | 9.10 |
| 9 | 40.00 | 8.00 | 20.25 | 7.50 | 1.50 | 0.50 | 0.75 | 0.25 | 21.00 | 0.00 | 0.25 | 9.10 |
| 10 | 40.00 | 8.00 | 20.25 | 7.50 | 1.50 | 0.50 | 0.75 | 0.25 | 21.00 | 0.00 | 0.25 | 9.10 |
| 11 | 40.00 | 8.00 | 20.25 | 7.50 | 1.50 | 0.50 | 0.75 | 0.25 | 21.00 | 0.00 | 0.25 | 9.10 |
| 12 | 71.90 | 0.00 | 18.10 | 0.00 | 0.00 | 0.00 | 0.00 | 0.00 | 10.00 | 0.00 | 0.00 | 8.78 |
| 13 | 41.20 | 8.30 | 21.00 | 7.90 | 1.60 | 0.60 | 0.80 | 0.20 | 18.15 | 0.00 | 0.25 | 9.25 |
| 14 | 43.80 | 8.10 | 21.00 | 7.90 | 1.60 | 0.60 | 0.80 | 0.20 | 12.00 | 4.00 | 0.00 | 9.19 |
| 15 | 38.60 | 8.30 | 2.60 | 21.00 | 1.60 | 0.60 | 0.80 | 0.20 | 26.00 | 0.00 | 0.30 | 9.78 |
| 16 | 57.20 | 7.50 | 14.60 | 0.00 | 0.00 | 0.00 | 0.00 | 0.00 | 20.70 | 0.00 | 0.00 | 9.02 |
| 17 | 39.95 | 8.05 | 20.35 | 7.65 | 1.55 | 0.60 | 0.80 | 0.20 | 20.60 | 0.00 | 0.25 | 9.35 |
| 18 | 64.50 | 0.00 | 18.10 | 0.00 | 0.00 | 0.00 | 0.00 | 0.00 | 17.40 | 0.00 | 0.00 | 8.49 |
| 19 | 39.95 | 8.05 | 20.35 | 7.65 | 1.55 | 0.60 | 0.80 | 0.20 | 20.60 | 0.00 | 0.25 | 9.35 |

On a surface of this base, a TiCN layer having a thickness indicated in Table 2 was formed by a CVD process. On the TiCN layer, an $Al_2O_3$ layer having a thickness indicated in Table 2 was further formed. The thicknesses of the TiCN layer and the $Al_2O_3$ layer were controlled by adjusting the deposition time.

The residual stresses of the TiCN layer and the $Al_2O_3$ layer were measured using the 2D method. Specifically, a measurement location was set at a section of the flank face, 1 mm or more away from the cutting edge 7, and X-ray diffraction peaks were measured from the surface side of the produced coated tool. For the crystal structure specified from the measurement result, the residual stress was obtained by determining a deviation of the value of 2θ in the measurement result from the value of 2θ serving as a standard described in the JCPDS card. For the TiCN layer, the residual stress was obtained with reference to the 422 plane. For the $Al_2O_3$ layer, the residual stress was obtained with reference to the 1310 plane. The obtained residual stresses are illustrated in Table 2.

The resulting coated tool underwent a cutting test under the following conditions. The results are illustrated in Table 2.

(Wear Resistance Test)
Workpiece material: SAPH440
Cutting speed: 1000 m/min
Feed: 0.15 mm/rev
Depth of cut: 0.25 mm
Cutting state: wet
Evaluation method: Flank face wear width (μm) at the point of time when a cutting length of 5.0 km was cut (Chipping Resistance Test)
Workpiece material: SAPH440 with 12 grooves (10 mm wide)
Cutting speed: 1000 m/min
Feed: 0.15 mm/rev
Depth of cut: 0.25 mm
Cutting state: wet
Evaluation method: Number of impacts until chipping occurs layer falls below 250 MPa, and the value of the compressive stress exerted on the $Al_2O_3$ layer falls below 450 MPa. As a result, the fracture resistance is inferior.

On the other hand, in all of the samples in which the thermal expansion coefficient of the base is $9.0 \times 10^{-6}/°$ C. or more, the compressive stress exerted on the TiCN layer is 250 to 500 MPa, the thickness of the $Al_2O_3$ layer is 2 μm or more, the compressive stress exerted on the $Al_2O_3$ layer is 450 MPa or more, and the value of the compressive stress is greater than that of the TiCN layer, the wear resistance and the fracture resistance are excellent.

Additional advantages and modifications will readily occur to those skilled in the art. Therefore, the invention in its broader aspects is not limited to the specific details and representative non-limiting embodiments shown and described herein. Accordingly, various modifications may be made without departing from the spirit or scope of the general inventive concept as defined by the appended claims and their equivalents.

The invention claimed is:

1. A coated tool comprising a base and a coating layer covering at least a part of the base, wherein
the base comprises:
  a hard phase of a carbonitride comprising Ti, and
  a binder phase comprising at least one of Co and Ni;
the base has a thermal expansion coefficient at 25° C. to 1000° C. of $9.0 \times 10^{-6}/°$ C. or more;
the coating layer comprises:
  a TiCN layer and
  an $Al_2O_3$ layer positioned on the TiCN layer;

TABLE 2

| | Coating properties | | | | | |
|---|---|---|---|---|---|---|
| | Compressive stress σ 11 [MPa] | | Film thickness [μm] | | Film thickness ratio $Al_2O_3$/ | Amount of flank face wear | Number of impacts until |
| Sample No. | TiCN | $Al_2O_3$ | TiCN | $Al_2O_3$ | ($Al_2O_3$ + TiCN) | [μm] | chipping occurs |
| 1 | 299 | 458 | 8.01 | 2.76 | 0.26 | 85 | 15972 |
| 2 | 392 | 462 | 7.57 | 2.67 | 0.26 | 90 | 25383 |
| 3 | 443 | 457 | 4.23 | 10.35 | 0.71 | 79 | 19924 |
| 4 | 412 | 398 | 7.91 | 10.00 | 0.56 | 63 | 4981 |
| 5 | 404 | 401 | 8.17 | 8.50 | 0.51 | 70 | 12011 |
| 6 | 391 | 451 | 8.08 | 7.99 | 0.50 | 79 | 15193 |
| 7 | 420 | 523 | 8.12 | 2.04 | 0.20 | 89 | 23051 |
| 8 | 423 | 618 | 7.66 | 1.90 | 0.20 | 134 | 32967 |
| 9 | 210 | 452 | 11.43 | 3.01 | 0.21 | 80 | 13853 |
| 10 | 253 | 516 | 9.89 | 3.11 | 0.24 | 88 | 15019 |
| 11 | 256 | 505 | 11.40 | 2.22 | 0.16 | 85 | 17214 |
| 12 | 204 | 448 | 5.01 | 3.99 | 0.44 | 146 | 9102 |
| 13 | 368 | 495 | 7.57 | 2.73 | 0.27 | 75 | 22474 |
| 14 | 342 | 453 | 7.79 | 2.85 | 0.27 | 77 | 16732 |
| 15 | 472 | 663 | 6.22 | 3.32 | 0.35 | 89 | 44745 |
| 16 | 521 | 452 | 6.13 | 4.98 | 0.45 | 85 | 12852 |
| 17 | 421 | 541 | 7.43 | 3.78 | 0.34 | 80 | 32001 |
| 18 | 340 | 432 | 8.69 | 2.92 | 0.25 | 85 | 10129 |
| 19 | 418 | 576 | 7.81 | 2.53 | 0.24 | 66 | 35746 |

According to Table 2, in sample Nos. 12 and 18 in which the thermal expansion coefficient of the base falls below $9.0 \times 10^{-6}/°$ C., since the thermal expansion difference between the base and the TiCN layer and the $Al_2O_3$ layer is small, the values of the compressive stresses exerted on the TiCN layer and the $Al_2O_3$ layer are small. In these samples, the value of the compressive stress exerted on the TiCN the TiCN layer has a compressive stress of 250 to 500 MPa;
the $Al_2O_3$ layer has a thickness of 2 μm or more and has a compressive stress of 450 MPa or more, the compressive stress of the $Al_2O_3$ layer being greater than the compressive stress of the TiCN layer.

2. The coated tool according to claim 1, wherein the $Al_2O_3$ layer has a thickness of 2.5 μm or more and 8.0 μm or less.

3. The coated tool according to claim 1, wherein the TiCN layer has a thickness of 5 μm or more and 10 μm or less.

4. The coated tool according to claim 1, wherein the thickness of the $Al_2O_3$ layer is in a range of 0.2 to 0.4 times a sum of the thickness of the TiCN layer and the thickness of the $Al_2O_3$ layer.

5. The coated tool according to claim 1, wherein the $Al_2O_3$ layer comprises $\alpha$-$Al_2O_3$ crystals, and the $\alpha$-$Al_2O_3$ crystals extend in a vertical direction relative to a main surface of the base.

6. A cutting tool comprising:

a holder extending from a first end to a second end and having a pocket on the first end side; and the coated tool according to claim 1 positioned in the pocket.

* * * * *